(12) United States Patent
Leigh et al.

(10) Patent No.: US 9,277,678 B2
(45) Date of Patent: Mar. 1, 2016

(54) MULTI-CHIP SOCKET

(71) Applicant: HEWLETT-PACKARD DEVELOPMENT COMPANY, L.P., Houston, TX (US)

(72) Inventors: Kevin B. Leigh, Houston, TX (US); George D. Megason, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/323,614

(22) Filed: Jul. 3, 2014

(65) Prior Publication Data
US 2014/0313686 A1 Oct. 23, 2014

Related U.S. Application Data

(62) Division of application No. 13/537,404, filed on Jun. 29, 2012, now Pat. No. 8,779,578.

(51) Int. Cl.
*H05K 7/20* (2006.01)
*H05K 7/10* (2006.01)
*H01L 23/13* (2006.01)
*H01L 23/32* (2006.01)
*H01L 23/36* (2006.01)
*H01R 12/71* (2011.01)
*H01R 43/20* (2006.01)
*H05K 3/32* (2006.01)

(52) U.S. Cl.
CPC .............. *H05K 7/2039* (2013.01); *H01L 23/13* (2013.01); *H01L 23/32* (2013.01); *H01L 23/36* (2013.01); *H01R 12/712* (2013.01); *H01R 43/205* (2013.01); *H05K 7/10* (2013.01); *H01L 2924/0002* (2013.01); *H05K 3/32* (2013.01); *H05K 2201/10325* (2013.01); *H05K 2201/10962* (2013.01); *Y10T 29/4913* (2015.01)

(58) Field of Classification Search
CPC ..... H05K 7/2039; H05K 7/10; H05K 12/712; H05K 3/32; H05K 2924/0002; H05K 2201/10962; H05K 2201/10325; H01L 2914/0002; H01L 2924/00; H01R 12/712; H01R 43/205
USPC ......... 257/712, 713, 674, 717, 720, 686, 685, 257/777, 723, 706, E21.506, E23.101, 257/E23.169; 361/783, 679.31, 704, 749, 361/760, 807; 439/68, 660; 29/825, 874
See application file for complete search history.

(56) References Cited

U.S. PATENT DOCUMENTS

| 2006/0207789 | A1* | 9/2006 | Soeta ............................. 174/260 |
| 2012/0083169 | A1* | 4/2012 | Heng et al. .................... 439/660 |
| 2013/0056863 | A1* | 3/2013 | Chi et al. ....................... 257/704 |
| 2014/0284040 | A1* | 9/2014 | Colgan et al. ................. 165/185 |

* cited by examiner

*Primary Examiner* — Alexander Oscar Williams
(74) *Attorney, Agent, or Firm* — Hewlett Packard Enterprise Patent Development

(57) ABSTRACT

A multi-chip socket including multiple cavities. The multiple cavities include support surfaces. The support surfaces may be disposed at different heights relative to a reference plane. A first thermal interface is to thermally contact a top surface of the first component, and a second thermal interface is to thermally contact a top surface of the second component.

19 Claims, 5 Drawing Sheets

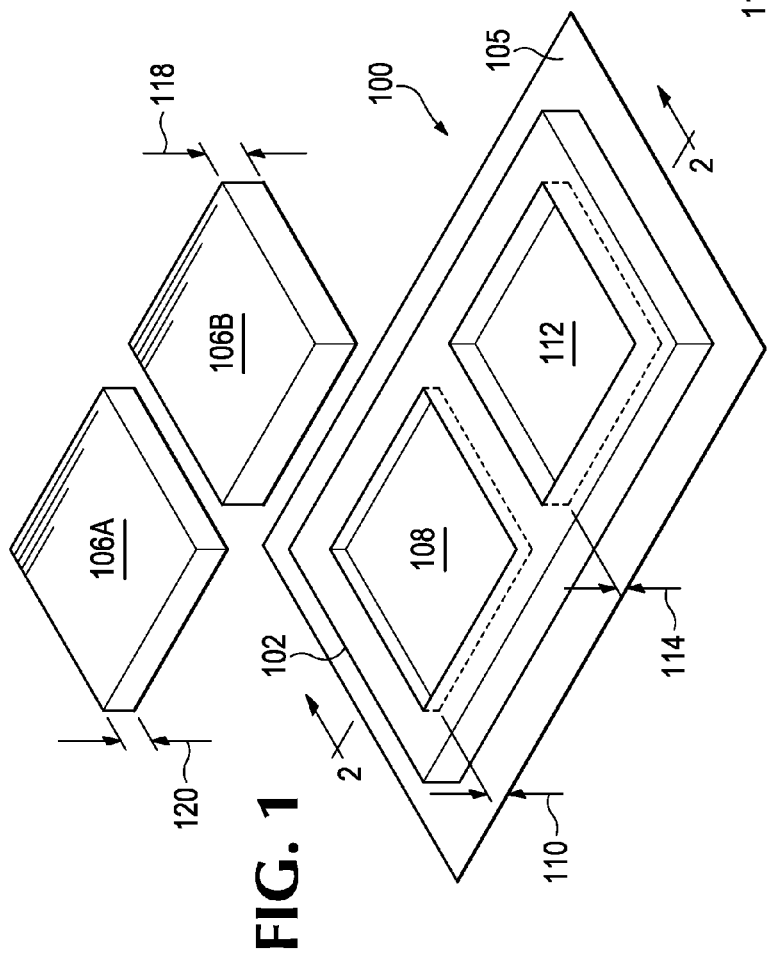
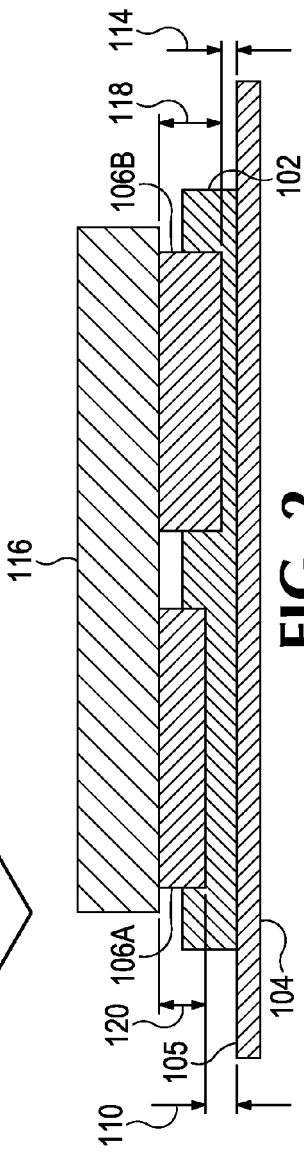

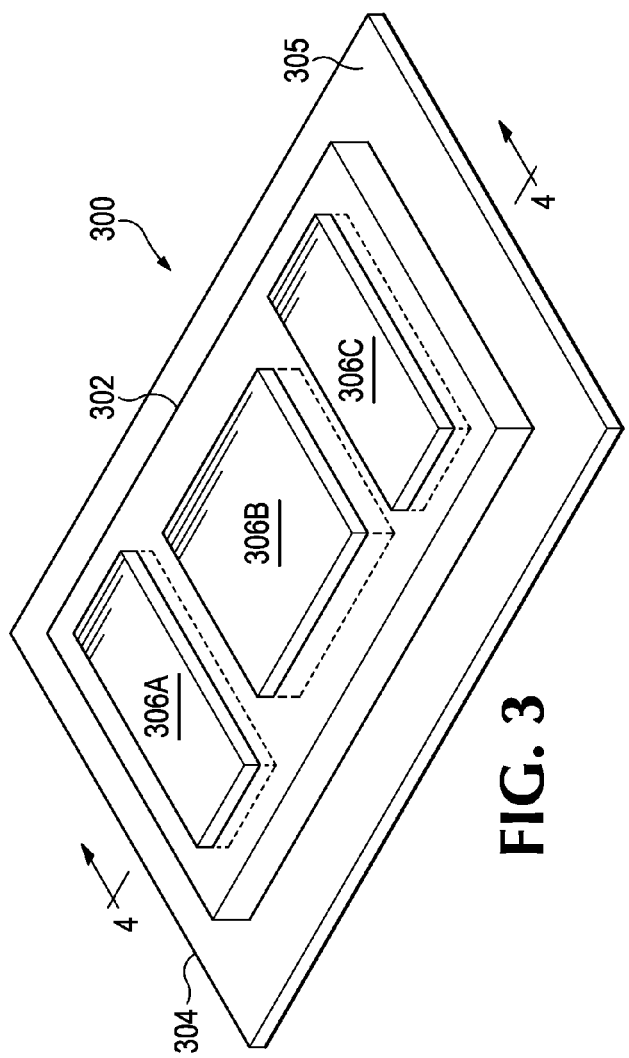
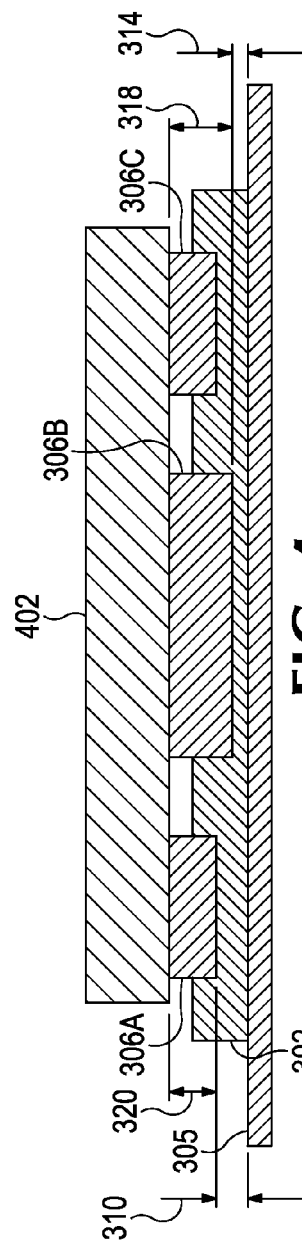

MULTI-CHIP SOCKET

CROSS-REFERENCE TO RELATED APPLICATION

This application is a divisional of U.S. application Ser. No. 13/537,404 filed Jun. 29, 2012, the disclosure of which is hereby incorporated by reference.

BACKGROUND

Computing devices may utilize multiple components arranged on a substrate, such as a printed circuit board (PCB), to perform various functions. The various components may have different shapes, sizes, and may be coupled to components on the same PCB or other PCBs. In various examples, chip sockets may be used to couple various ones of these components to the PCBs. In other examples, the components may be directly coupled to the PCBs.

BRIEF DESCRIPTION OF THE DRAWINGS

FIG. 1 is an exploded view of a multi-chip socket in accordance with an example of the present disclosure;

FIG. 2 is a cross-sectional view of the multi-chip socket of FIG. 1 in accordance with an example of the present disclosure;

FIG. 3 is a perspective view of a multi-chip socket in accordance with an example of the present disclosure;

FIG. 4 is a cross-sectional view of the multi-chip socket of FIG. 3 in accordance with the present disclosure;

DETAILED DESCRIPTION

Figure 5:
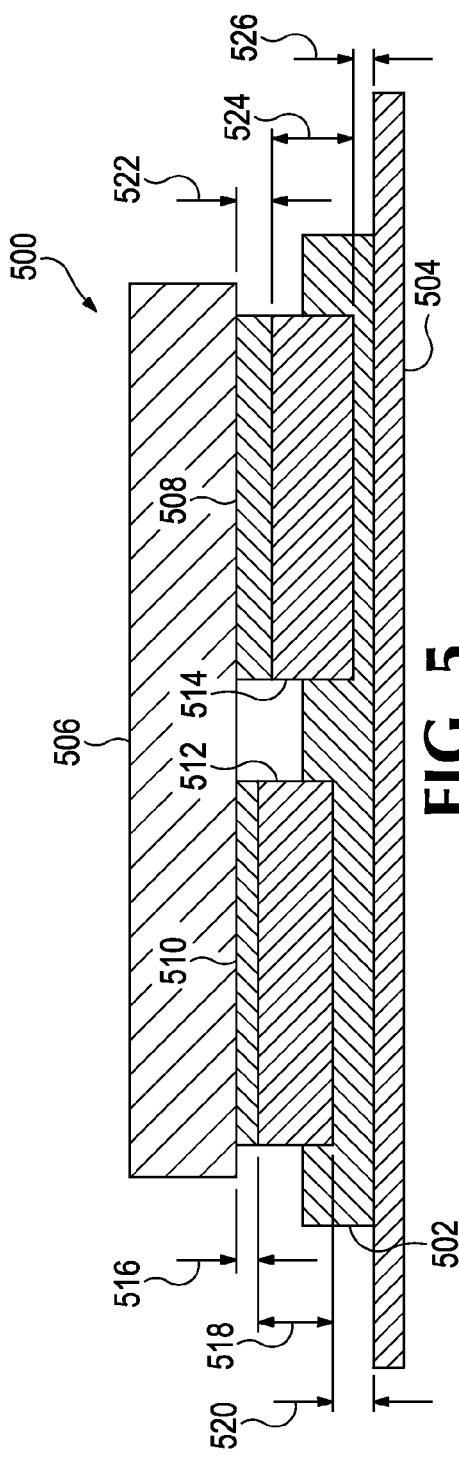
FIG. 5 is a cross-sectional view of an example multi-chip socket utilizing heat extraction devices.

In various computing devices, there may be several printed circuit assemblies (PCAs). A PCA including components are interconnected on a printed circuit board (PCB) via one or more traces. For example, multiple dynamic random access memories (DRAMs) may be placed on PCB to form a dual in-line memory module (DIMM) PCA. The multiple DIMMs may be coupled to an associated processor and placed on a motherboard printed circuit assembly (PCA). Interconnecting multiple PCAs (the DIMMs) on a larger PCA (the motherboard) adds several connectors that may affect signal integrity, cost, and reliability issues.

For example, prepopulating components on a PCB and then mounting the PCA (i.e., the components on the PCB) on another PCA (e.g., a motherboard) involves multiple levels of PCAs and bulky packaging. The multiple components of the PCAs may have varying package heights. The different heights of the components may lead to an increase in a number of heat extraction devices within a system as a single heat extraction device may not be capable of coupling to multiple components.

As another example, components may be coupled directly to a PCB, such as a motherboard. The coupling of components directly to a PCB may decrease a yield as errors within the individual components may be attributed to the motherboard itself. This may lead to replacement of the motherboard, and consequently, all components directly coupled to the motherboard when a component or grouping of components is at fault.

The present disclosure relates to the aforementioned issues and provides solutions to multiple issues associated with interconnecting various components on a PCB. In the present disclosure, a multi-chip socket is disclosed with multiple cavities configured to support various components at same or different heights relative to a reference. The cavities may include same or different depths that allow chips of same or different thicknesses to utilize a single-plane heat extraction device, such as a heat sink, heat pipe, and/or cold plate.

In various examples, the multi-chip socket can incorporate signal connectivity including, but not limited to, electrical and/or optical connectivity. For example, electrical signals may be routed on, around, and within the multi-chip socket. In addition, optical signals may be routed via optical fibers embedded within or through the multi-chip socket. The multi-chip socket as disclosed herein may enable fewer layers within a PCB, allow the use of smaller PCBs, lower an overall PCA cost, and enable better signal integrity by routing traces through the multi-chip socket instead of using multiple chip modules and routing signals via the PCB. In the ensuing discussion, reference may be made to multi-chip sockets incorporating electrical connectivity. It is to be understood, however, that various components discussed below can also be utilized in conjunction with optical components.

Referring to FIG. 1, a multi-chip socket 102 is illustrated as part of the system 100 in accordance with an example of the present disclosure. The multi-chip socket 102 includes a first cavity 108 and a second cavity 112 coupled to the first cavity 108.

The first cavity 108 is configured to support a first component 106A at a first height 110 with respect to a reference plane 105. A cavity, as used herein, is any area configured to support a component. A cavity may include a recess disposed within a multi-chip socket, or in other examples, may include one or more guides disposed on a surface of a multi-chip socket configured to define an area for the component. Additionally, a reference plane as used herein, is any plane common to cavities of a multi-chip socket. In the illustrated example, the reference plane 105, as illustrated, is being coplanar with a bottom surface of the multi-chip socket 102.

The second cavity 112 is communicatively coupled to the first cavity 108 and is to support a second component 106B at a second height 114 with respect to the reference plane 105. The first height 110 and the second height 114 may be determined in response to the heights 120, 118 of the first component 106A and the second component 106B, respectively.

The first component 106A and the second component 106B may be a processor, an application specific integrated circuit (ASIC), a memory component, or generally any integrated circuit or component configured to modularly couple to a substrate or chip socket. The disclosure is not to be limited in this manner.

In one example, the first cavity 108 is to support the first component 106A at a first height 110 above the reference plane 105. The first height 110 may be determined based upon a height 120 of the first component 106A. Similarly, the second cavity 112 may be configured to support a second component 106B relative to the reference plane 105. The second height 114 may be determined based upon the height 118 of the second component 106B relative to the reference plane 105. The determinations of the heights 110 and 114 may be made such that a top surface of the first component 106A and the second component 106B are substantially coplanar. Coplanar as used herein relates to one surface of a component relative to one surface of a second component being substantially in the same plane.

In various examples, the multi-chip socket 102 may be mounted on a substrate such as a PCB (not illustrated). The multi-chip socket 102 may be mounted utilizing a variety of techniques and fasteners, including electrical solders, mechanical fasteners and/or adhesives (not illustrated). The multi-chip socket 102 may be mounted with components 106A, 106B populated therein, or alternatively, may be mounted in a vacant state such that components 106A, 106B may be included at a later time. Various techniques and fasteners may also be utilized to secure the components 106A, 106B within the multi-chip socket 102. In addition, the multi-chip socket 102 may include various contacts, channels, or other manners of communicating signals to the substrate (e.g. PCB) below the multi-chip socket 102 and/or other components on the substrate which are intended to communicate with the components 106A, 106B.

Referring to FIG. 2, a cross-sectional view of the multi-chip socket is illustrated in accordance with an example of the present disclosure. As illustrated, the multi-chip socket 102 is mounted on a PCB 104. A first cavity 108 is configured to support a first chip 106A at a first height 110 with respect to the reference plane 105, which in this illustrated example may be a top surface of the PCB 104. Similarly, a second cavity 112 is configured to support a second chip 106B at a second height 114 above the reference plane 105. The first and second heights 110, 114 are configured to compensate for the height 120 of the first component 106A and the height 118 of the second component 106B, such that the top surfaces of the first component 106A and the second component 106B are substantially coplanar.

In the illustrated embodiment, a single plane heat extraction device 116 is illustrated as being coupled to each of the first component 106A and the second component 106B. The heat extraction device may be, for example, a cooling plate, a thermal interface, a heat sink, or another heat removal component. In this manner, a single heat extraction device 116 may be utilized in conjunction with multiple components 106A, 106B. In various other examples, multiple independent heat extraction devices may be utilized with the components 106A, 106B.

Referring to FIG. 3, another example of a multi-chip socket is illustrated in accordance with the present disclosure. The multi-chip socket 302 includes three cavities in which components 306A, 306B, and 306C are disposed. The heights of the supporting surfaces within the cavities that support components 306A, 306B, 306C are determined such that the top surfaces of the components 306A, 306B, 306C are substantially coplanar. In other words, the system 300 includes a first component disposed within a first cavity wherein a support surface of the first cavity is in a first plane. The multi-chip socket may include a second component communicatively coupled to the first component and disposed within a second cavity of the multi-chip socket, wherein a support surface of the second cavity is in a second plane that is different than the first plane. In various examples, the multi-chip socket may include a third component communicatively coupled to the first component and/or the second component within a third cavity having a support surface in a third plane. The third plane may be different from or the same as the first plane and/or the second plane.

In one example, component 306B may be a processor or memory controller while components 306A and 306C may be memory modules. Various traces may be disposed within the the multi-chip socket 302 such that the various components are communicatively coupled to one another. More or fewer components may be disposed within the multi-chip socket 302. For example, multiple components may be disposed within a single cavity. Alternatively, the multi-chip socket 302 may include additional cavities having support surfaces in additional planes.

In another example, components 306A and 306C may be ASICs while component 306B is an electrical/optical (E/O) engine. The E/O engine may be configured to convert electrical signals to optical signals and vice versa. Again, various traces and/or optical fibers may be disposed within the multi-chip socket 302 such that the various components are communicatively coupled to one another.

Referring to FIG. 4, a cross-sectional view of the system of FIG. 3 is illustrated. As illustrated, the components 306A, 306B, and 306C have top surfaces that are substantially coplanar. The top surfaces enable a single plane component 402 such as a heat extraction device, to span the components 306A, 306B, 306C or the multi-chip socket 302. As illustrated, the cavity supporting the first component 306A has a support surface in a first plane, the plane defined at the height 310 relative to a reference plane 305. The second component 306B is supported by a cavity having a support surface in a second plane defined by the height 314 relative to the reference plane 305. The third component 306C is supported by a cavity having a support surface defined by the first plane having a height 310 relative to the reference plane 305. In other examples, more or fewer components may be disposed in cavities including support surfaces in more or fewer planes.

While FIG. 4 illustrates a single heat extraction device 402 spanning the substantially coplanar components 306a, 306B, 306C, the disclosure is not so limited. Rather, in various other examples, multiple heat extraction devices may be utilized in conjunction with different groupings of components. For example, one heat extraction device may be utilized with components 306B, 306C, while an independent heat extraction device is utilized with component 306A. Other combinations are contemplated.

Referring to FIG. 5, another example of a multi-chip socket is illustrated. In the illustrated example, a multi-chip socket 502 is coupled to a PCB 504, a heat extraction device 506 and individual thermal interface devices 510, 508. In the illustrated example, the multi-chip socket 502 includes a first cavity having a support surface in a first plane defined by height 520 and a second cavity having a support surface in a second plane defined by height 526. The first and second planes are determined such that a height 518 of a first component 512 and a height 516 of its thermal interface device 510 attached thereto are substantially equivalent to a height 524 of a second component 514 and a height 522 of its thermal interface device 508. This may enable the heat extraction device 506 to contact both the first thermal interface device 510 and the second thermal interface device 508 to provide cooling.

Figure 6:
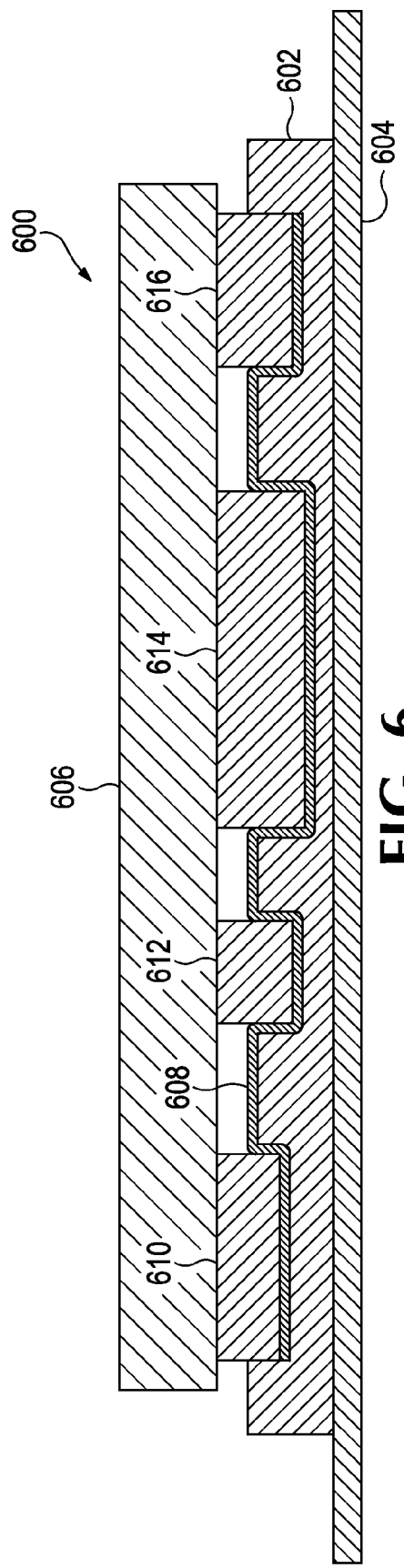
FIG. 6 is a cross-sectional view of an example multi-chip socket utilizing a flexible circuit.

Referring to FIG. 6, another system is illustrated in accordance with an example of the present disclosure. The system 600 includes a multi-chip socket including four cavities configured to support and communicatively couple components 610, 612, 614, and 616 to one another and to additional components. In addition to the components, the multi-chip socket 602 is further configured for use with a flexible circuit 608. A flexible circuit is a single- or multi-layer electrical circuit fabricated on a flexible dielectric material such that the flexible circuit may bend and form to a particular shape.

In the illustrated example, the flexible circuit 608 includes a uniform thickness. In other examples, the flexible circuit may include varying thicknesses and include contacts which may progress through cavities within the multi-chip socket 602 to couple the various components to the PCB 604. The multi-chip socket 602 may be configured to support the flexible circuit 608 and the multiple components 610, 612, 614, and 616 in a manner such that a surface of the components 610, 612, 614, and 616 or a component attached thereto, are substantially coplanar. In various examples, being substantially coplanar enables the use of a single heat extraction device across multiple components.

In one example, system 600 may include a component 612 configured to convey configuration information associated with system 600 to one or more components coupled to system 600. Configuration information may include data related to a configuration of the various components, manufacturing information, data related to versions of hardware, software, and/or firmware, topology information, compatibility information, among other data. The component 612 may be configured to communicate the configuration information signal conveyed via the flexible circuit, or may use other manners of conveying data including, but not limited to, wireless communication signaling, radio frequency identification (RFID), among others. The configuration information may enable a computing device to locate and utilize system 600.

Figure 7:
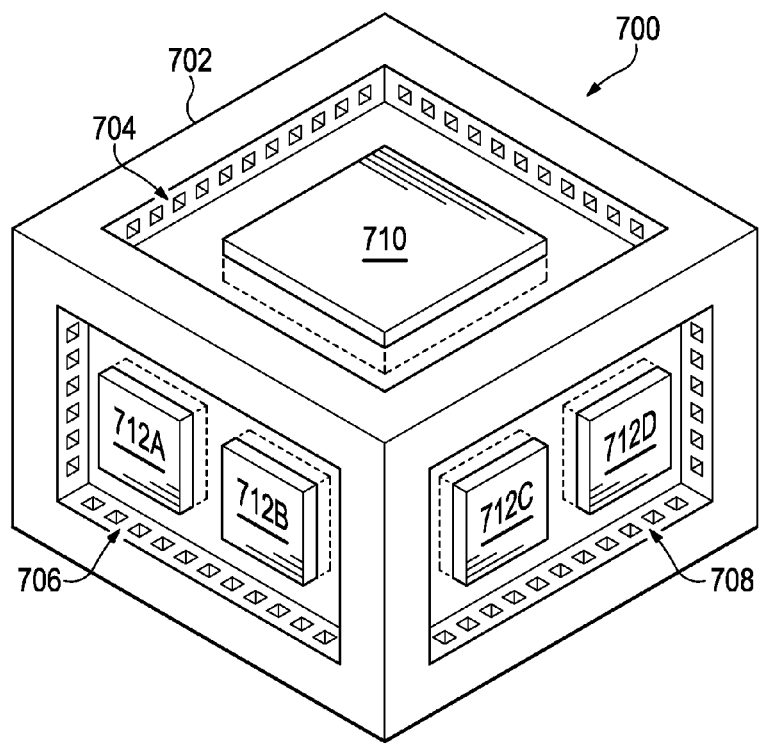
FIG. 7 is a perspective view of a multi-chip socket in accordance with an example of the present disclosure.

Referring to FIG. 7, another example of a multi-chip socket system 700 is illustrated. In the illustrated example, multi-chip socket 702 is illustrated with three cavities 704, 706, and 708. The first cavity 704 may include a support surface in a first plane (horizontal plane) and support a first component 710. A second cavity 706 may include a support surface in a second plane (vertical plane) and support multiple components 712A, 712B. A third cavity 708 may include a support surface in a third plane (vertical plane) and support multiple components 712C, 712D. In this manner, multiple planes may be utilized to position various components at different heights relative to corresponding reference planes. Disposing various components on multiple sides of a multi-chip socket may better utilize space within an electronic component by moving components vertically off of a PCB.

Figure 8:
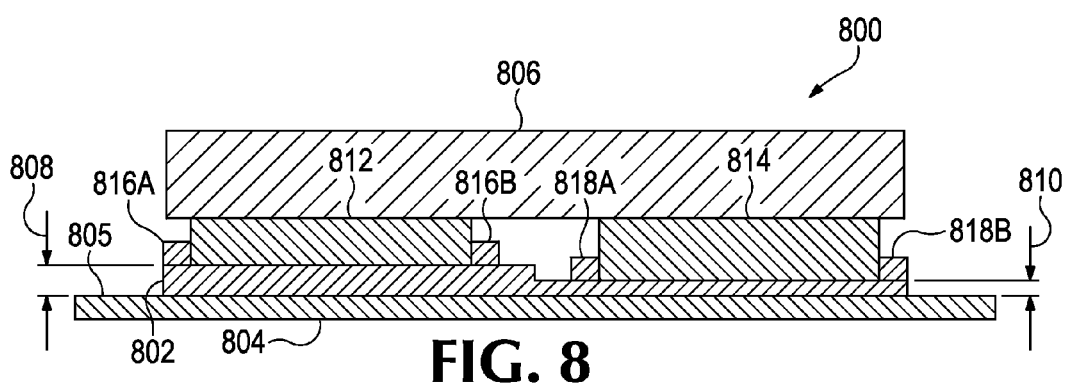
FIG. 8 is a cross-sectional view of an example multi-chip socket utilizing a guide in accordance with an example of the present disclosure.

Referring to FIG. 8, a cross-sectional view of another system is illustrated in accordance with an example of the present disclosure. The system 800 includes a multi-chip socket 802 coupled to a substrate 804 (e.g. a PCB). The multi-chip socket 802 includes a first cavity formed by guides 816A, 816B, and the multi-chip socket 802; and a second cavity formed by guides 818A, 818B, and the multi-chip socket 802. The first cavity and the second cavity are configured to support a first component 812 and a second component 814, respectively.

The multi-chip socket 802 is configured to support the first component 812 at a first height 808 above a reference plane 805 and the second component 814 at a second height 810 above the reference plane 805. In the illustrated example, the reference plane 805 is a top surface of PCB or substrate 804. The first height 808 and the second height 810 are configured such that a top surface of the first component 812 and the second component 814 are substantially coplanar.

To facilitate alignment of the first component 812 and the second component 814 to the multi-chip socket 802 and to form the first cavity and the second cavity, one or more guides 816A-B, 818A-B may be coupled to a surface of the multi-chip socket 802. The guides 816A-B, 818A-B may be configured to engage one or more sides of the various components 812, 814, respectively, to facilitate proper positioning of the various components. The guides 816A-B, 818A-B may engage only a portion of the various components, and consequently, may form only a partial cavity. In such an example, the partial cavity may still define a support surface. In various examples, the guides may include various shapes, materials, and mechanisms. For example, one guide may include a mechanical mechanism for securing a component within the multi-chip socket 802.

Figure 9:
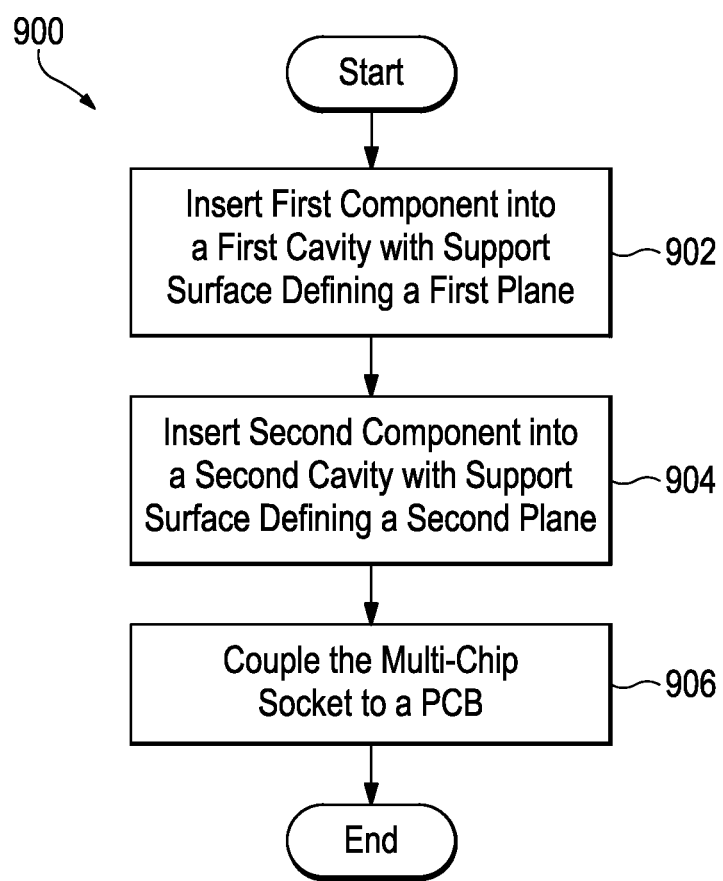
FIG. 9 is a flow diagram in accordance with an example of the present disclosure.

Referring to FIG. 9, a flow diagram is illustrated in accordance with various examples. The flow diagram illustrates processes in a particular order. The order of the processes is not meant to limit the disclosure. Rather, it is expressly intended that one or more of the processes may occur in other orders or simultaneously. The disclosure is not to be limited to any particular example.

Referring to FIG. 9, a method 900 may begin and progress to 902 where a first component may be inserted into a first cavity having a support surface defining a first plane relative to a reference. In various examples, the first plane may be a horizontal plane or a vertical plane. Additionally, the first cavity may be configured such that additional space is provided within cavity for heat extraction purposes.

Progressing to 904, a second component may be inserted into a second cavity having a support surface defining a second plane. The first plane and the second plane may be determined relatively to one another such that one surface the first component and the second component are substantially coplanar. Similar to the first cavity, in various examples, the second cavity may have a support plane in a horizontal or vertical plane and the cavity may be sized such that additional space is provided for heat extraction purposes.

Upon inserting the second component at 904, the multi-chip socket may be coupled to a PCB at 906. Coupling the multi-chip socket to the PCB at 906 may form a PCA. The PCA may then be utilized for an intended purpose.

In additional examples, heat extraction devices having various heights may be attached to the first component and the second component. In such an example, the support surfaces of the first cavity and the second cavity may be configured such that at least one surface of the first heat extraction device and the second heat extraction device are coplanar. In examples, where additional components are to be included, the multi-chip socket may be configured with additional cavities and support surfaces to bring surfaces of the additional components in a coplanar alignment with existing components.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a wide variety of ways. This application is intended to cover any adaptations or variations of the embodiments discussed herein. For example, various mechanical retention devices and/or manners of coupling various components to a multi-chip socket, and the multi-chip socket to a substrate may be utilized without deviating from the scope of the disclosure. Therefore, it is manifestly intended that embodiments be limited only by the claims and the equivalents thereof.

What is claimed is:

1. An apparatus comprising:
   a multi-chip socket comprising:
      a first cavity having a first support surface to support a first component including a first chip, the first support surface arranged to contact and support the first chip, and the first support surface being at a first height with respect to a reference plane;

a second cavity electrically coupled to the first cavity and having a second support surface to support a second component including a second chip, the second support surface arranged to contact and support the second chip, and the second support surface being at a second, different height with respect to the reference plane;

a first thermal interface to thermally contact a top surface of the first component;

a second thermal interface to thermally contact a top surface of the second component; and a heat extraction device arranged to thermally connect to a top surface of the first thermal interface and a top surface of the second thermal interface, the top surfaces of the first thermal interface and the second thermal interface being coplanar.

2. The apparatus of claim 1, wherein the first chip includes a first integrated circuit (IC) chip, and the second chip includes a second IC chip.

3. The apparatus of claim 1, wherein the first height is a height of the first support surface above the reference plane, and the second height is a height of the second support surface above the reference plane.

4. The apparatus of claim 3, wherein the reference plane corresponds to a surface of a substrate on which the multi-chip socket is to be mounted.

5. The apparatus of claim 1, wherein the first height defines a first depth of the first cavity, and the second height defines a second, different depth of the second cavity.

6. The apparatus of claim 1, wherein the first thermal interface has a first thickness, and the second thermal interface has a second, different thickness, wherein the first thickness and the second thickness are provided such that the top surface of the first thermal interface and the top surface of the second thermal interface are coplanar.

7. The apparatus of claim 1, wherein the first height and the second height are provided such that the top surface of the first thermal interface and the top surface of the second thermal interface are coplanar.

8. A system, comprising:
a multi-chip socket including a first cavity and a second cavity;

a first component including a first integrated circuit (IC) chip disposed within the first cavity, wherein a first support surface of the first cavity is in a first plane, and the first support surface is in contact with and supports the first IC chip;

a second component including a second IC chip communicatively coupled to the first component and disposed within the second cavity, wherein a second support surface of the second cavity is in a second plane that is different than the first plane, and the second support surface is in contact with and supports the second IC chip;

a first thermal interface in contact with a top surface of the first component;

a second thermal interface in contact with a top surface of the second component; and a single heat extraction device thermally connected to a top surface of the first thermal interface and a top surface of the second thermal interface, wherein the top surface of the first thermal interface and the top surface of the second thermal interface are coplanar.

9. The system of claim 8, wherein the first IC chip is a processor and the second IC chip is a memory device.

10. The system of claim 8, wherein the first IC chip is an application specific integrated circuit (ASIC) and the second IC chip is an electrical/optical (E/O) engine.

11. The system of claim 8, further comprising a printed circuit board on which the multi-chip socket is disposed, wherein the first plane is at a first height above a surface of the printed circuit board, and the second plane is at a second, different height above the surface of the printed circuit board.

12. The system of claim 11, wherein the first height defines a first depth of the first cavity, and the second height defines a second, different depth of the second cavity.

13. The system of claim 8, wherein the first thermal interface has a first thickness, and the second thermal interface has a second, different thickness, wherein the first thickness and the second thickness are provided such that the top surface of the first thermal interface and the top surface of the second thermal interface are coplanar.

14. The system of claim 11, wherein the first height and the second height are provided such that the top surface of the first thermal interface and the top surface of the second thermal interface are coplanar.

15. A method comprising:
arranging a multi-chip socket on a circuit board, wherein the multi-chip socket comprises:
a first cavity having a first support surface to support a first component including a first chip, the first support surface arranged to contact and support the first chip, and the first support surface being at a first height with respect to a reference plane;

a second cavity having a second support surface to support a second component including a second chip, the second support surface arranged to contact and support the second chip, and the second support surface being at a second, different height with respect to the reference plane;

a first thermal interface in contact with a top surface of the first component;

a second thermal interface in contact with a top surface of the second component; and a second thermal interface in contact with a top surface of the second component; and thermally connecting a single heat extraction device to a top surface of the first thermal interface and a top surface of the second thermal interface, the top surfaces of the first thermal interface and the second thermal interface being coplanar.

16. The apparatus of claim 1, wherein the heat extraction device includes a single heat sink contacted to the top surface of the first thermal interface, and the top surface of the second thermal interface.

17. The system of claim 8, wherein the single heat extraction device includes a single heat sink thermally connected to the top surfaces of the first and second thermal interfaces.

18. The method of claim 15, wherein the single heat extraction device includes a single heat sink thermally connected to the top surfaces of the first and second thermal interfaces.

19. The method of claim 15, wherein the first thermal interface has a first thickness, and the second thermal interface has a second, different thickness, wherein the first thickness and the second thickness are provided such that the top surface of the first thermal interface and the top surface of the second thermal interface are coplanar.

* * * * *